United States Patent
Li et al.

(10) Patent No.: US 9,201,445 B2
(45) Date of Patent: Dec. 1, 2015

(54) GATE DRIVING CIRCUIT FOR THIN FILM TRANSISTOR LIQUID CRYSTAL DISPLAY AND THIN FILM TRANSISTOR LIQUID CRYSTAL DISPLAY

(71) Applicants: BOE Technology Group Co., Ltd., Beijing (CN); Chengdu BOE Optoelectronics Technology Co., Ltd., Chengdu (CN)

(72) Inventors: Tianma Li, Beijing (CN); Xiaojing Qi, Beijing (CN)

(73) Assignees: BOE Technology Group Co., Ltd., Beijing (CN); Chengdu BOE Optoelectronics Technology Co., Ltd., Beijing (CN)

( * ) Notice: Subject to any disclaimer, the term of this patent is extended or adjusted under 35 U.S.C. 154(b) by 151 days.

(21) Appl. No.: 13/995,142
(22) PCT Filed: Nov. 2, 2012
(86) PCT No.: PCT/CN2012/084022
§ 371 (c)(1),
(2) Date: Jun. 17, 2013
(87) PCT Pub. No.: WO2013/135061
PCT Pub. Date: Sep. 19, 2013

(65) Prior Publication Data
US 2014/0085283 A1 Mar. 27, 2014

(30) Foreign Application Priority Data
Mar. 14, 2012 (CN) .......................... 2012 1 0067475

(51) Int. Cl.
*G09G 3/36* (2006.01)
*G06F 1/04* (2006.01)
(Continued)

(52) U.S. Cl.
CPC ................ *G06F 1/04* (2013.01); *G09G 3/3677* (2013.01); *G11C 19/184* (2013.01); *G11C 19/28* (2013.01); *G09G 2310/0286* (2013.01); *G09G 2310/06* (2013.01)

(58) Field of Classification Search
CPC .............................. G09G 3/36–3/3696; G09G 2310/02–2310/0297

USPC .......................................................... 345/100
See application file for complete search history.

(56) References Cited

U.S. PATENT DOCUMENTS 7,697,655 B2    4/2010  Chan et al.
2004/0227718 A1*  11/2004  Park .............................. 345/100
(Continued)

FOREIGN PATENT DOCUMENTS

CN          1553456 A       12/2004
CN          1702497 A       11/2005
(Continued)

OTHER PUBLICATIONS

International Search Report for International Application No. PCT/CN2012/084022, 13pgs.
(Continued)

*Primary Examiner* — Sanghyuk Park

(57) ABSTRACT

A gate driving circuit and a display, the gate driving circuit comprises a plurality of shift register connected in cascade. The shift register comprises: a signal outputting circuit (32), a signal inputting circuit (31), an inverting circuit (33) and a logic circuit (33). The signal outputting circuit (32) receives a forward direction clock signal from an external circuit and comprises a clock transistor and a level transistor. The signal outputting circuit outputs the forward direction clock signal when the clock transistor is turned on and outputs a constant-low level signal when the level transistor is turned on. The signal inputting circuit (31) receives an output signal from a previous shift register, and turns on the clock transistor when the received output signal of the previous shift register is valid. The inverting circuit (33) receives an inverse direction clock signal from the external circuit, turns off the clock transistor and turns on the level transistor at the same time when the inverse direction clock signal is valid. The logic circuit (33) holds the clock transistor as being turned on before the level transistor is turned on. The gate driving circuit has low power consumption, strong capability of anti-interference and a stable output wave.

18 Claims, 3 Drawing Sheets

(51) Int. Cl.
*G11C 19/18* (2006.01)
*G11C 19/28* (2006.01)

(56) References Cited

U.S. PATENT DOCUMENTS

| | | |
|---|---|---|
| 2005/0264505 A1 | 12/2005 | Kim |
| 2008/0016139 A1 | 1/2008 | Tsai et al. |
| 2008/0165169 A1 | 7/2008 | Lee |
| 2008/0266234 A1 | 10/2008 | Ieong et al. |
| 2011/0134090 A1 | 6/2011 | Iwamoto et al. |

FOREIGN PATENT DOCUMENTS

| | | |
|---|---|---|
| CN | 101295546 A | 10/2008 |
| CN | 101303838 A | 11/2008 |
| CN | 102132356 A | 7/2011 |
| CN | 102651208 A | 8/2012 |
| WO | 2011148655 A1 | 12/2011 |

OTHER PUBLICATIONS

First Office Action issued by the Chinese Patent Office for Chinese Patent Application No. 201210067475.3 dated May 6, 2013, 6pgs.

English translation of First Office Action issued by the Chinese Patent Office for Chinese Patent Application No. 201210067475.3 dated May 6, 2013, 4pgs.

International Preliminary Report on Patentability for International Application No. PCT/CN2012/084022 dated Sep. 16, 2014, 7pgs.

\* cited by examiner

GATE DRIVING CIRCUIT FOR THIN FILM TRANSISTOR LIQUID CRYSTAL DISPLAY AND THIN FILM TRANSISTOR LIQUID CRYSTAL DISPLAY

CROSS REFERENCE TO RELATED APPLICATIONS

This application is based on International Application No. PCT/CN2012/084022 filed on Nov. 2, 2012, which claims priority to Chinese National Application No. 201210067475.3, filed on Mar. 14, 2012, the contents of which are incorporated herein by reference.

TECHNICAL FIELD OF THE DISCLOSURE

The present disclosure relates to a technical field of display, and in particular relates to a gate driving circuit and a display for a Thin Film Transistor Liquid Crystal Display (called as TFT-LCD briefly).

BACKGROUND

In the TFT-LCD, a basic principle for displaying picture in each frame is as follows: a source driver outputs data signals required by pixels in each row sequentially row-by-row, while a gate driver gates the pixels in each row by inputting a square wave having a certain width to gates of the pixels in each row sequentially row-by-row.

A traditional method is to bind a gate driver IC and a source driver IC on a glass panel by a Chip on Glass (COG) process. However, during an actual manufacturing process, when a resolution of the TFT-LCD is high, the number of output lines for gate driving is large and a length of the gate driver IC may be increased, which may not only increase difficulty in the COG process, but also reduce an excellent rate of the products.

To this end, those skilled in the art proposed a technique of Gate Driver on Array (thereafter will be called as GOA briefly) which manufactures the gate driver IC on the glass panel by an array process. This technique may reduce cost of product, increase reliability of the panel, and also may decrease the difficulty in an IC binding for the TFT-LCD having small size.

Shift registers are used to form a gate driving circuit for generating waves required at gates in the GOA technique. FIG. 1 is a diagram illustrating a circuit principle of an existing shift register. Referring FIG. 1, the shift register comprises four transistors and two capacitors, each of the transistors comprises a gate, a source and a drain. Wherein a drain of the first transistor T1, a source of the second transistor T2, a gate of the third transistor T3, a first terminal of the first capacitor C1 and a first terminal of the second capacitor C2 converge to form a node P. A gate and a source of the first transistor T1 are connected with each other and serve as a signal input terminal STV of the shift register; a drain of the first transistor T1 is connected to the source of the second transistor T2; a gate of the second transistor T2 is connected to a gate of the fourth transistor T4 and receives a reset signal Reset externally, a drain of the second transistor T2 receives a low level signal Voff from an external circuit; a source of the third transistor T3 receives a second clock signal CLK2 from the external circuit, the gate of the third transistor T3 is connected to a node P, and a drain of the third transistor T3 is connected to a source of the fourth transistor T4 and a second terminal of the second capacitor C2 and serves as an output terminal Row of the shift register; the gate of the fourth transistor T4 is connected to the gate of the second transistor T2, the drain of the fourth transistor T4 is connected to the drain of the second transistor T2 and receives the low level signal Voff from the external circuit; the second terminal of the first capacitor C1 is connected to a first clock signal CLK1, the first terminal thereof is connected to the node P; the first terminal of the second capacitor C2 is connected to the node P, and the second terminal thereof is connected to the source of the third transistor T3 and the source of the fourth transistor T4.

However, a clock frequency used in the above shift register is high, such that the gate driving circuit for generating waves required at gates not only has high power consumption and a poor capability of anti-interference, but also has a small output power and more big burrs. Further, floating may occur at the output terminal of the shift register sometimes, which may lead to an unstable output wave.

SUMMARY

To the above disadvantages occurred in the prior art, a technical problem to be settled in the present disclosure is to provide a gate driving circuit which has low power consumption, a strong capability of anti-interference and a stable wave.

Therefore, the present disclosure further provides a display which has low power consumption and a strong capability of anti-interference.

According to embodiments of the present disclosure, there is provided a gate driving circuit comprising a plurality of shift register connected in cascade, the shift register comprising:

a signal outputting circuit which receives a forward direction clock signal from an external circuit and comprises a clock transistor and a level transistor, wherein the signal outputting circuit outputs the forward direction clock signal when the clock transistor is turned on and outputs a constant-low level signal when the level transistor is turned on;

a signal inputting circuit which is connected to a gate of the clock transistor and receives an output signal from a previous shift register, and turns on the clock transistor when the received output signal of the previous shift register is valid;

an inverting circuit which is connected to the gate of the clock transistor and a gate of the level transistor, and receives an inverse direction clock signal from the external circuit, wherein the inverting circuit turns off the clock transistor and turns on the level transistor at the same time when the inverse direction clock signal is valid;

a logic circuit which is connected to the clock transistor and holds the clock transistor as being turned on before the level transistor is turned on.

In an example, the signal inputting circuit, the signal outputting circuit, the inverting circuit and the logic circuit converge to form a first node; the signal outputting circuit and the inverting circuit converge to form a second node.

In an example, the signal outputting circuit, the signal inputting circuit and the inverting circuit are all composed of MOS type transistors.

In an example, the signal inputting circuit comprises a first transistor, a drain and a gate of the first transistor are connected to the output signal of the previous shift register; a source of the first transistor is connected to the first node.

In an example, the clock transistor comprises a second transistor, the level transistor comprises a third transistor; a drain of the second transistor receives the forward direction clock signal from the external circuit; a gate of the second transistor is connected to the first node; a source of the second transistor and a drain of the third transistor are connected with each other and serve as an output terminal of the signal outputting circuit collectively; a gate of the third transistor is connected to the second node; a source of the third transistor receives the low level signal from the external circuit.

In an example, the inverting circuit comprises a fourth transistor and a fifth transistor, a drain of the fourth transistor receives a high level signal from the external circuit; a gate of the fourth transistor is connected to a gate of the fifth transistor, and both of them receive the inverse direction clock signal from the external circuit; a source of the fourth transistor is connected to the second node; a drain of the fifth transistor is connected to the first node; a source of the fifth transistor receives the low level signal from the external circuit.

In an example, the logic circuit comprises a capacitor, a first terminal of the capacitor is connected to the first node, and a second terminal of the capacitor is connected to the low level signal from the external circuit.

In an example, the shift register further comprises: a holding circuit for ensuring the level transistor being held as turned off when the clock transistor is turned on.

In an example, the holding circuit comprises a sixth transistor and a seventh transistor, a drain of the sixth transistor and a drain of the seventh transistor are connected with each other and are connected to the second node collectively; a gate of the sixth transistor is connected to the first node; a source of the sixth transistor and a source of the seventh transistor are connected with each other and receive the low level signal from the external circuit collectively; a gate of the seventh transistor receives the forward direction clock signal from the external circuit.

The present disclosure further provides a display comprising a gate driving circuit which adopts the gate driving circuit described above.

The present disclosure has advantages as follows.

First, the signal inputting circuit of the gate driving circuit may turn on the clock transistor after receiving the output signal of the previous shift register being valid; further, the inverting circuit may turn off the clock transistor and turn on the level transistor after receiving the inverse direction clock signal from the external circuit being valid; thus the clock frequency may be decreased and in turn power consumption of the gate driving circuit may be reduced, which may enhance the capability of anti-interference of the gate driving circuit.

Second, the logic circuit may hold the clock transistor as being turned on before the level transistor is turned on, which may reduce burrs in the output wave and increase stability of the output wave in the gate driving circuit.

Third, the gate driving circuit provided in the present disclosure may utilize fewer transistors, that is, may obtain a wave required at gates with fewer transistors, which may reduce cost of the gate driving circuit.

Therefore, the display provided in the present disclosure uses a low clock frequency as scanning, so that power consumption of the display is decreased, capability of anti-interference of the display is enhanced and in turn picture quality of the display is improved. Additionally, the gate driving circuit uses fewer transistors, thus cost of the display is reduced.

DETAILED DESCRIPTION

Below will describe the gate driving circuit and the display provided in the embodiments of the present disclosure in connection with the accompanying drawings, so that those skilled in the art may understand the solutions of the present disclosure well. Obviously the described embodiments are only a part of embodiments of the present disclosure but not the whole. Based on the embodiments of the present disclosure, other embodiments made by those ordinary skilled in the art without any inventive labors will fall into the scope sought for protection of the present invention.

Figure 1:
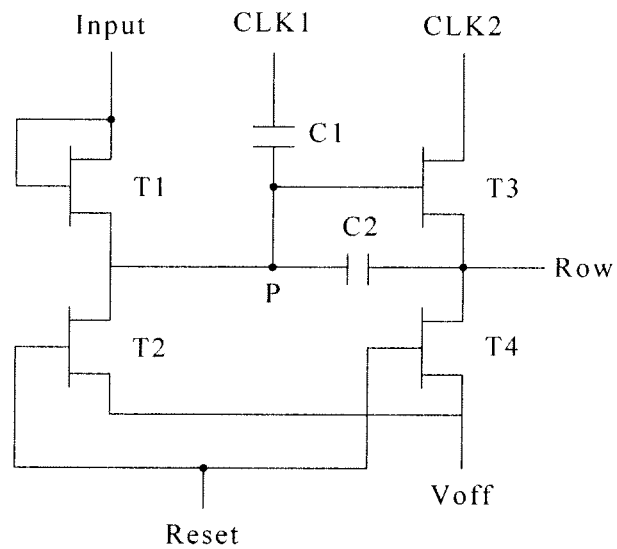
FIG. 1 is a diagram illustrating a circuit principle of an existing shift register.
Figure 2:
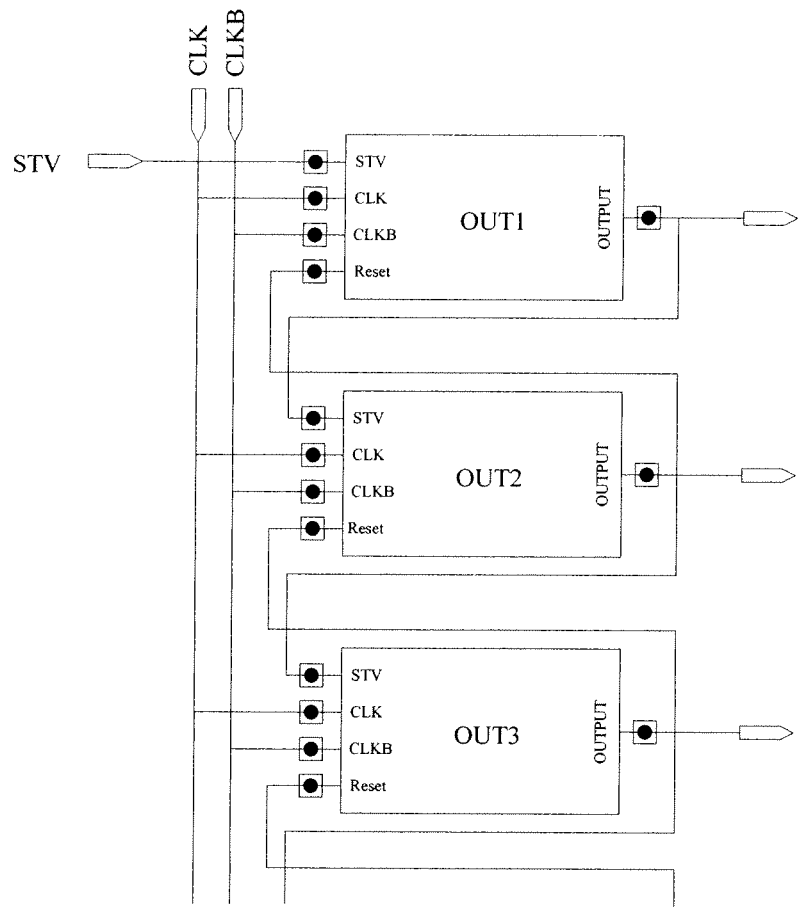
FIG. 2 is a block diagram illustrating a structure of a gate driving circuit according to an embodiment of the present disclosure.

FIG. 2 is a block diagram illustrating a structure of a gate driving circuit according to an embodiment of the present disclosure. Referring FIG. 2, the gate driving circuit provided by the present embodiment comprises a plurality of shift registers OUT1, OUT2 and OUT3 having a same circuit structure, the plurality of the shift registers are connected in cascade and receive a forward direction clock signal CLK and an inverse direction clock signal CLKB having a phase difference of 180° with the forward direction clock signal CLK provided from an external circuit sequentially, and an input terminal STV of a shift register is connected to an output terminal OUTPUT of a previous shift register.

Figure 3:
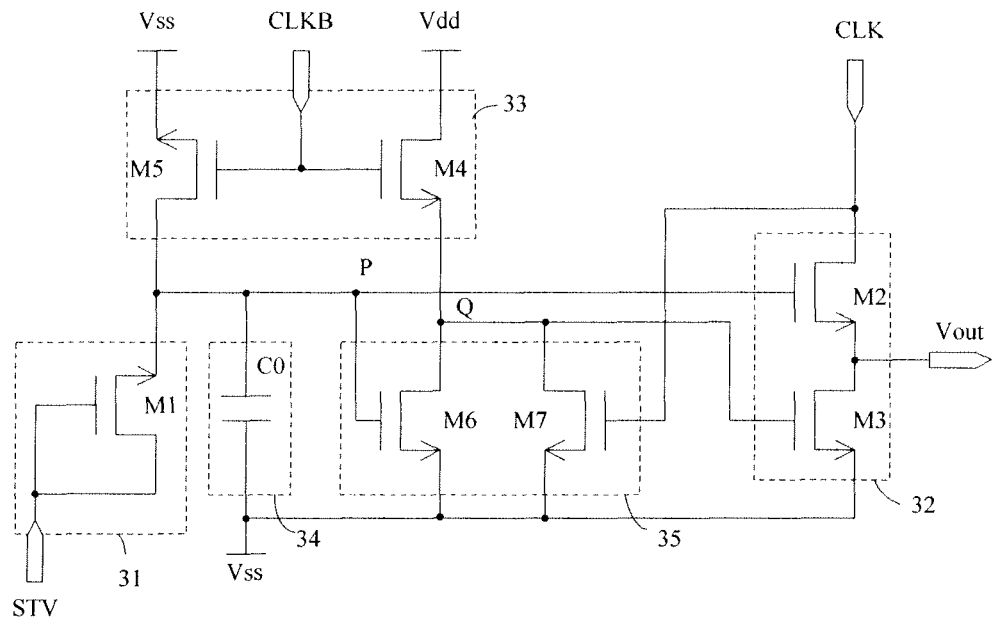
FIG. 3 is a diagram illustrating a circuit principle of a shift register in the gate driving circuit according to the embodiment of the present disclosure.

FIG. 3 is a diagram illustrating a circuit principle of a shift register in the gate driving circuit according to the embodiment of the present disclosure. Referring FIGS. 2 and 3 together, each of the shift registers comprises:

a signal outputting circuit 32 which receives a forward direction clock signal CLK from an external circuit and comprises a clock transistor and a level transistor, wherein the signal outputting circuit 32 outputs the forward direction clock signal when the clock transistor is turned on and outputs a constant-low level signal when the level transistor is turned on;

a signal inputting circuit 31 which is connected to a gate of the clock transistor and receives an output signals from a previous shift register, and turns on the clock transistor when the received output signal of the previous shift register is valid;

an inverting circuit 33 which is connected to the gate of the clock transistor and a gate of the level transistor, and receives an inverse direction clock signal CLKB from the external circuit, wherein the inverting circuit turns off the clock transistor and turns on the level transistor at the same time when the inverse direction clock signal CLKB is valid;

a logic circuit 34 which is connected to the gate the clock transistor and holds the clock transistor as being turned on before the level transistor is turned on.

wherein the signal inputting circuit 31, the signal outputting circuit 32, the inverting circuit 33, the logic circuit 34 and a holding circuit 35 converge to form a first node P; the signal outputting circuit 32 and the inverting circuit 33 converge to form a second node Q.

Furthermore, the signal inputting circuit 31, the signal outputting circuit 32 and the inverting circuit 33 are all composed of MOS type transistors.

The signal inputting circuit 31 comprises a first transistor M1, a drain and a gate of the first transistor M1 are connected with each other, and serve as an input terminal STV of the shift register collectively, which in turn connects to an output terminal OUTPUT (an output terminal of the signal outputting circuit 32) of the previous shift register so as to receive an output signal of the previous shift register; a source of the first transistor M1 is connected to the first node P.

The clock transistor in the signal outputting circuit 32 comprises a second transistor M2, the level transistor comprises a third transistor M3; a drain of the second transistor M2 receives the forward direction clock signal CLK from the external circuit; a gate of the second transistor M2 is connected to the first node P; a source of the second transistor M2 and a drain of the third transistor M3 are connected with each other and serve as an output terminal of the shift register collectively; a gate of the third transistor M3 is connected to the second node Q; a source of the third transistor M3 receives the low level signal Vss from the external circuit.

The inverting circuit 33 comprises a fourth transistor M4 and a fifth transistor M5, a drain of the fourth transistor M4 receives a high level signal Vdd from the external circuit; a gate of the fourth transistor M4 is connected to a gate of the fifth transistor M5, and both of them receive the inverse direction clock signal CLKB from the external circuit; a source of the fourth transistor M4 is connected to the second node Q; a drain of the fifth transistor M5 is connected to the first node P; a source of the fifth transistor M5 receives the low level signal Vss from the external circuit.

The logic circuit 34 comprises a capacitor C0, a first terminal of the capacitor C0 is connected to the first node P, and a second terminal of the capacitor C0 is connected to the low level signal Vss from the external circuit.

When the third transistor M3 is turned off, the logic circuit 34 may hold the first node P as being the high level, so that the second transistor M2 may be held as being turned on. Thus, the signal outputting circuit 32 may output a stable clock signal and in turn the shift register may output a stable wave.

In an example, the shift register further comprises:

a holding circuit 35 for ensuring the level transistor being held as turned off when the clock transistor is turned on.

The holding circuit 35 is connected with the signal outputting circuit 32 and the inverting circuit 33 at the second node Q, and the holding circuit 35 is composed of NMOS type transistors.

The holding circuit 35 comprises a sixth transistor M6 and a seventh transistor M7, a drain of the sixth transistor M6 and a drain of the seventh transistor M7 are connected with each other and are connected to the second node Q collectively; a gate of the sixth transistor M6 is connected to the first node P; a source of the sixth transistor M6 and a source of the seventh transistor M7 are connected with each other and receive the low level signal Vss from the external circuit collectively; a gate of the seventh transistor M7 receives the forward direction clock signal CLK from the external circuit.

The present embodiment holds the third transistor M3 as being turned off by means of the holding circuit 35 when the second transistor M2 is turned on, which may prevent the clock signal output from the signal outputting circuit from being affected due to the turning on of the third transistor M3, so that the shift register may output the stable wave.

Figure 4:
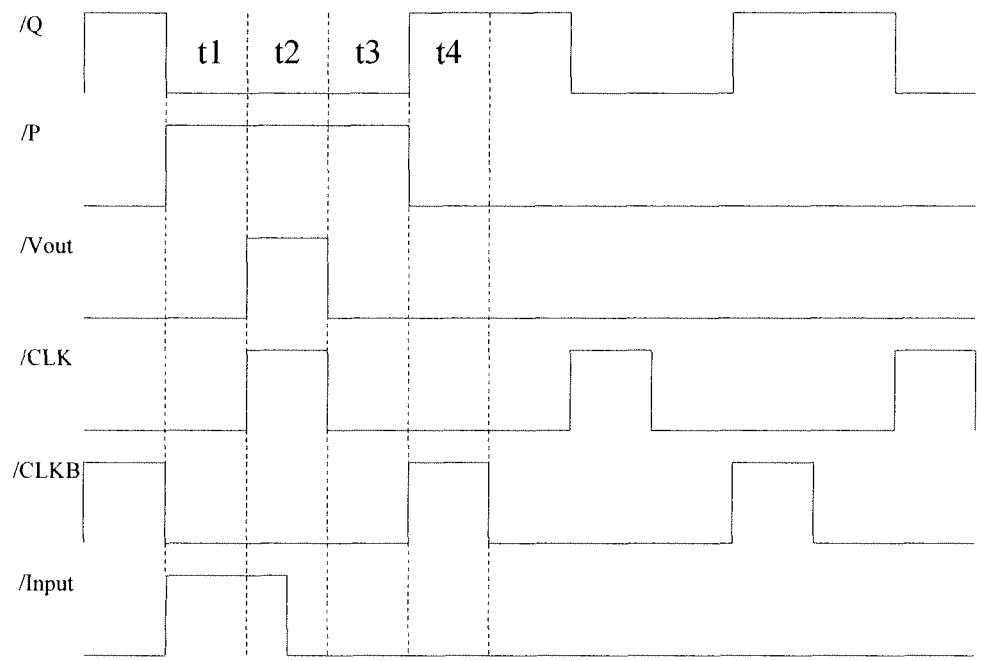
FIG. 4 is an operation timing diagram of the shift register in the gate driving circuit according to the embodiment of the present disclosure.

FIG. 4 is an operation timing diagram of the shift register in the gate driving circuit according to the embodiment of the present disclosure. Referring FIGS. 3 and 4 together, before a time period t1, a high level is applied to the inverse direction clock signal CLKB at first so as to turn on the fifth transistor M5, then the capacitor C0 is discharged, so that the first node P is in a low level and in turn the second transistor M2 is turned off. Meanwhile, the fourth transistor M4 is turned on and the second node Q is in the high level, so that the third transistor M3 is turned on and the shift register outputs the low level.

During the time period t1, the inverse direction clock signal CLKB inputs a low level signal, the fourth transistor M4 and the fifth transistor M5 are turned off. The input terminal STV of the shift register receives a start signal which is a high level signal, or called as an Input signal, the first transistor M1 is turned on, the capacitor C0 is charged, the first node P is in the high level, so that the sixth transistor M6 is turned on so as to ensure the second node Q as being in the low level, the third transistor M3 is turned off. Meanwhile, the second transistor M2 is turned on, the forward direction clock signal CLK outputs a low level clock signal, thus the output terminal Vout of the shift register outputs the low level.

During a time period t2, the inverse direction clock signal CLKB inputs the low level signal, the fourth transistor M4 and the fifth transistor M5 are turned off. The first node P is still in the high level because the capacitor C0 is charged, the second transistor M2 and the sixth transistor M6 are turned on, the second node Q is in the low level, and the third transistor M3 is turned off. The forward direction clock signal CLK outputs a high level clock signal, the output terminal Vout of the shift register outputs the high level. Meanwhile, the sixth transistor M6 and the seventh transistor M7 are turned on, which may ensure the second node Q being in the low level and the third transistor M3 being turned off, therefore the output signal from the output terminal Vout of the shift register is synchronized with the output of the forward direction clock signal CLK, that is, the output from the output terminal Vout of the shift register is in the high level.

During a time period t3, the inverse direction clock signal CLKB inputs the low level signal, the fourth transistor M4 and the fifth transistor M5 are turned off. The first node P is still in the high level because of the capacitor C0, the second transistor M2 and the sixth transistor M6 are turned on, the second node Q is in the low level, and the third transistor M3 is turned off. The forward direction clock signal CLK outputs the low level clock signal, the output terminal Vout of the shift register outputs the low level. Meanwhile, the seventh transistor M7 is turned off and the sixth transistor M6 is turned on, which may ensure the second node Q being in the high level and the third transistor M3 being turned off.

During a time period t4, the forward direction clock signal CLK inputs the low level clock signal, the seventh transistor M7 is turned off. The inverse direction clock signal CLKB input the high level signal, the fourth transistor M4 and the fifth transistor M5 are turned on. Since the fifth transistor M5 is turned on, the capacitor C0 is discharged, the first node P is in the low level, the second transistor M2 and the sixth transistor M6 are turned off. Since the fourth transistor M4 is turned on, the second node Q is in the high level, the third transistor M3 is turned on, thus the output terminal Vout of the shift register outputs the low level.

Figure 5:
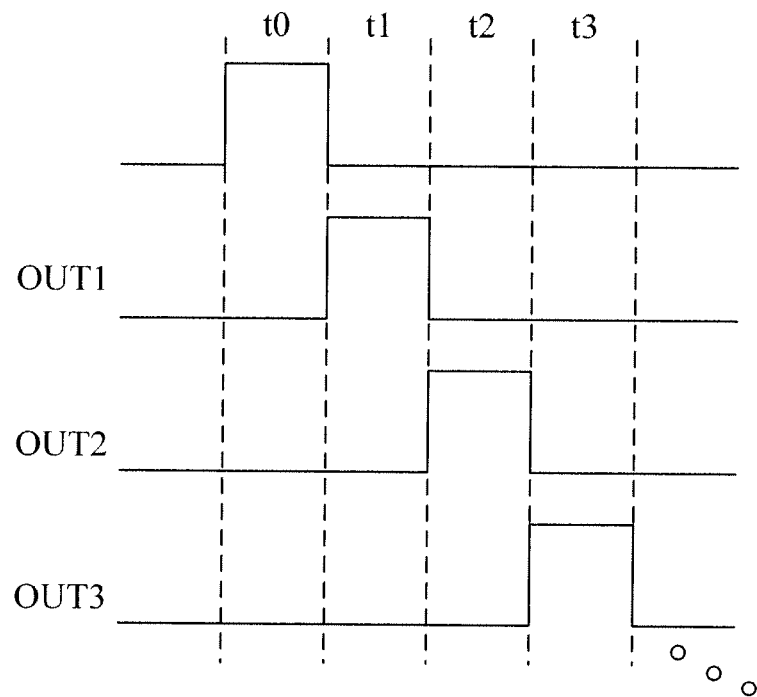
FIG. 5 is a diagram illustrating an output wave of the gate driving circuit according to the embodiment of the present disclosure.

From the operation timing, the shift register utilizes a low clock frequency, so that the power consumption in the gate driving circuit may be decreased effectively and the capability of anti-interference in the gate driving circuit may be improved. Further, the output wave of the shift register is stable, so that the output of the gate driving circuit is stable, as illustrated in FIG. 5 which illustrates an output wave of the gate driving circuit according to the embodiment of the present disclosure. Further, the gate driving circuit according to the embodiment of the present disclosure can obtain the stable wave required at gates only with fewer transistors, thus reducing production cost of the gate driving circuit.

It should note that although the gate driving circuit in the present embodiment is composed of the NMOS type transistors, the present disclosure is not limited thereto. Obviously the gate driving circuit may be composed of PMOS type transistors and may achieve the same technical effects as those achieved by the NMOS type transistors.

The gate driving circuit provided in the present embodiment has advantages as follows.

First, the signal inputting circuit of the gate driving circuit may turn on the clock transistor after receiving a valid output signal of the previous shift register; further, the inverting circuit may turn off the clock transistor and turn on the level transistor after receiving a valid inverse direction clock signal from the external circuit; thus the clock frequency may be decreased and in turn the power consumption of the gate driving circuit may be reduced, which may enhance the capability of anti-interference of the gate driving circuit.

Second, the logic circuit may hold the clock transistor as being turned on before the level transistor is turned on, which may reduce burrs in the output wave and increase the stability of the output wave in the gate driving circuit.

Third, the gate driving circuit may obtain the wave required at gates with fewer transistors, which may reduce the cost of the gate driving circuit.

Figure 6:
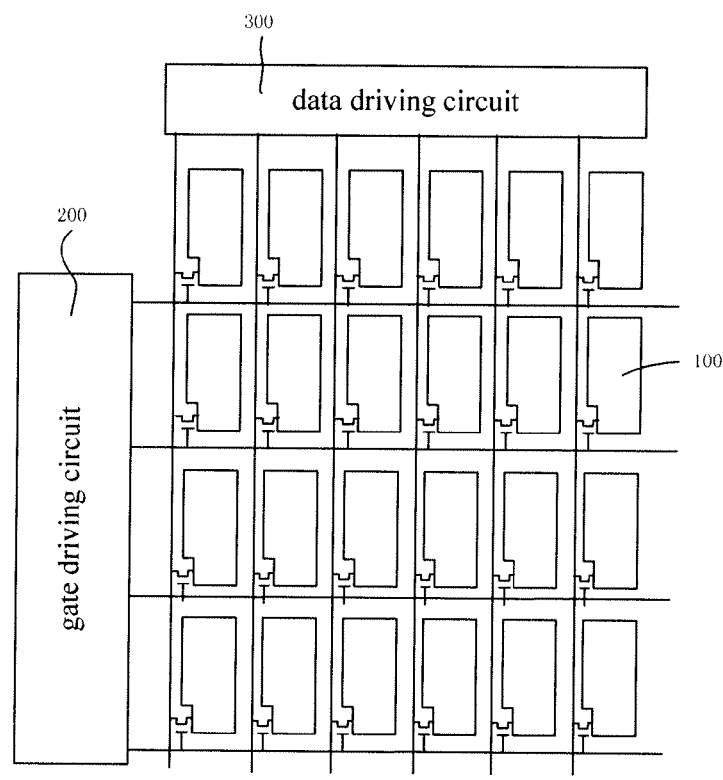
FIG. 6 is a schematic diagram illustrating a structure of a display according to the embodiment of the present disclosure.

FIG. 6 is a schematic diagram illustrating a structure of a display according to the embodiment of the present disclosure. Referring to FIG. 6, the display comprises a liquid crystal display panel, a gate driving circuit 200 and a data driving circuit 300, wherein the liquid crystal display panel comprises an array substrate 100, a color filter film substrate (not shown in FIG. 6) and liquid crystal molecules (not shown in FIG. 6) disposed between the array substrate 100 and the color filter film substrate, a thin film transistor array for controlling torsion angles of the liquid crystal molecules is arranged on the array substrate 100, and the gate driving circuit 200 outputs a row driving signal to control turning on or turning off of the thin film transistors. Further, the gate driving circuit 200 adopts the gate driving circuit provided in the present embodiment.

Although the present disclosure have been described by making the liquid crystal display as an example above, the present disclosure may be applied to other display apparatus, such as an OLED display apparatus, which comprise a pixel array and are driven in a row or column manner, other than the liquid crystal display.

Because the display in the present embodiment adopts the gate driving circuit provided in the above embodiment, it uses a low clock frequency as scanning, so that the power consumption of the display is decreased, the capability of anti-interference of the display is enhanced and in turn the picture quality of the display is improved. Additionally, the gate driving circuit uses fewer transistors, thus the cost of the display is reduced.

Please note that manufacturing processes of the source "s" and drain "g" in the various transistors described above are the same, so their names may be exchanged with each other and are changed depending on a direction of voltage. Furthermore, types of the respective transistors in a same pixel circuit may be same or not same, as long as the high level and low level in the timings of the corresponding gate strobe signal source is adjusted according to characteristics of threshold voltages of the respective transistors. Of course preferably, the types of the transistors requiring a same gate strobe signal source are same. More preferably, the types of all of the thin film transistors in a same pixel circuit are same, and all of them are n-type transistors or p-type transistors.

It should understand that, the above are only exemplary embodiments of the disclosed solution, but the scope sought for protection is not limited thereto. Instead, any or all modifications or replacements as would be obvious to those skilled in the art are intended to be included within the scope of the present invention. Therefore, the scope of the present invention is defined in the appended claim.

What is claimed is:

1. A gate driving circuit comprising a plurality of shift register connected in cascade, the shift register comprising:
    a signal outputting circuit which receives a forward direction clock signal from an external circuit and comprises a clock transistor and a level transistor, wherein the signal outputting circuit outputs the forward direction clock signal when the clock transistor is turned on and outputs a constant-low level signal when the level transistor is turned on;
    a signal inputting circuit which is connected to a gate of the clock transistor and receives an output signals from a previous shift register, and turns on the clock transistor when the received output signal of the previous shift register is valid;
    an inverting circuit which is connected to the gate of the clock transistor and a gate of the level transistor, and receives an inverse direction clock signal from the external circuit, wherein the inverting circuit turns off the clock transistor and turns on the level transistor at the same time when the inverse direction clock signal is valid;
    a logic circuit which is connected to the clock transistor and holds the clock transistor as being turned on before the level transistor is turned on.

2. The gate driving circuit of claim 1, wherein the signal inputting circuit, the signal outputting circuit, the inverting circuit and the logic circuit converge to form a first node; the signal outputting circuit and the inverting circuit converge to form a second node.

3. The gate driving circuit of claim 2, wherein the signal outputting circuit, the signal inputting circuit and the inverting circuit are all composed of MOS type transistors.

4. The gate driving circuit of claim 3, wherein the signal inputting circuit comprises a first transistor, a drain and a gate of the first transistor are connected to the output signal of the previous shift register; a source of the first transistor is connected to the first node.

5. The gate driving circuit of claim 3, wherein the clock transistor comprises a second transistor, the level transistor comprises a third transistor; a drain of the second transistor receives the forward direction clock signal from the external circuit; a gate of the second transistor is connected to the first node; a source of the second transistor and a drain of the third transistor are connected with each other and serve as an output terminal of the signal outputting circuit collectively; a gate of the third transistor is connected to the second node; a source of the third transistor receives the low level signal from the external circuit.

6. The gate driving circuit of claim 3, wherein the inverting circuit comprises a fourth transistor and a fifth transistor, a drain of the fourth transistor receives a high level signal from the external circuit; a gate of the fourth transistor is connected to a gate of the fifth transistor, and both of them receive the inverse direction clock signal from the external circuit; a source of the fourth transistor is connected to the second node; a drain of the fifth transistor is connected to the first node; a source of the fifth transistor receives the low level signal from the external circuit.

7. The gate driving circuit of claim 3, wherein the logic circuit comprises a capacitor, a first terminal of the capacitor is connected to the first node, and a second terminal of the capacitor is connected to the low level signal from the external circuit.

8. The gate driving circuit of claim 1, the shift register further comprises:
a holding circuit for ensuring the level transistor being held as turned off when the clock transistor is turned on.

9. The gate driving circuit of claim 8, wherein the holding circuit comprises a sixth transistor and a seventh transistor, a drain of the sixth transistor and a drain of the seventh transistor are connected with each other and are connected to the second node; a gate of the sixth transistor is connected to the first node; a source of the sixth transistor and a source of the seventh transistor are connected with each other and receive the low level signal from the external circuit collectively; a gate of the seventh transistor receives the forward direction clock signal from the external circuit.

10. A display comprising a gate driving circuit, wherein the gate driving circuit adopts a gate driving circuit comprising a plurality of shift register connected in cascade, the shift register comprising:
a signal outputting circuit which receives a forward direction clock signal from an external circuit and comprises a clock transistor and a level transistor, wherein the signal outputting circuit outputs the forward direction clock signal when the clock transistor is turned on and outputs a constant-low level signal when the level transistor is turned on;
a signal inputting circuit which is connected to a gate of the clock transistor and receives an output signals from a previous shift register, and turns on the clock transistor when the received output signal of the previous shift register is valid;
an inverting circuit which is connected to the gate of the clock transistor and a gate of the level transistor, and receives an inverse direction clock signal from the external circuit, wherein the inverting circuit turns off the clock transistor and turns on the level transistor at the same time when the inverse direction clock signal is valid;
a logic circuit which is connected to the clock transistor and holds the clock transistor as being turned on before the level transistor is turned on.

11. The display of claim 10, wherein the signal inputting circuit, the signal outputting circuit, the inverting circuit and the logic circuit converge to form a first node; the signal outputting circuit and the inverting circuit converge to form a second node.

12. The display of claim 11, wherein the signal outputting circuit, the signal inputting circuit and the inverting circuit are all composed of MOS type transistors.

13. The display of claim 12, wherein the signal inputting circuit comprises a first transistor, a drain and a gate of the first transistor are connected to the output signal of the previous shift register; a source of the first transistor is connected to the first node.

14. The display of claim 12, wherein the clock transistor comprises a second transistor, the level transistor comprises a third transistor; a drain of the second transistor receives the forward direction clock signal from the external circuit; a gate of the second transistor is connected to the first node; a source of the second transistor and a drain of the third transistor are connected with each other and serve as an output terminal of the signal outputting circuit collectively; a gate of the third transistor is connected to the second node; a source of the third transistor receives the low level signal from the external circuit.

15. The display of claim 12, wherein the inverting circuit comprises a fourth transistor and a fifth transistor, a drain of the fourth transistor receives a high level signal from the external circuit; a gate of the fourth transistor is connected to a gate of the fifth transistor, and both of them receive the inverse direction clock signal from the external circuit; a source of the fourth transistor is connected to the second node; a drain of the fifth transistor is connected to the first node; a source of the fifth transistor receives the low level signal from the external circuit.

16. The display of claim 12, wherein the logic circuit comprises a capacitor, a first terminal of the capacitor is connected to the first node, and a second terminal of the capacitor is connected to the low level signal from the external circuit.

17. The display of claim 10, the shift register further comprises:
a holding circuit for ensuring the level transistor being held as turned off when the clock transistor is turned on.

18. The display of claim 17, wherein the holding circuit comprises a sixth transistor and a seventh transistor, a drain of the sixth transistor and a drain of the seventh transistor are connected with each other and are connected to the second node; a gate of the sixth transistor is connected to the first node; a source of the sixth transistor and a source of the seventh transistor are connected with each other and receive the low level signal from the external circuit collectively; a gate of the seventh transistor receives the forward direction clock signal from the external circuit.

* * * * *